United States Patent
Yamada et al.

(10) Patent No.: US 11,152,893 B2
(45) Date of Patent: Oct. 19, 2021

(54) POWER AMPLIFYING CIRCUIT AND POWER AMPLIFIER

(71) Applicant: Murata Manufacturing Co., Ltd., Kyoto (JP)

(72) Inventors: Takashi Yamada, Kyoto (JP); Toshikazu Terashima, Kyoto (JP); Yuuki Oomae, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 64 days.

(21) Appl. No.: 16/589,332

(22) Filed: Oct. 1, 2019

(65) Prior Publication Data

US 2020/0106389 A1 Apr. 2, 2020

(30) Foreign Application Priority Data

Oct. 2, 2018 (JP) .............................. JP2018-187328

(51) Int. Cl.
 *H03F 3/191* (2006.01)
 *H03F 1/02* (2006.01)
 (Continued)

(52) U.S. Cl.
 CPC ............ *H03F 1/0205* (2013.01); *H03F 3/193* (2013.01); *H03F 3/211* (2013.01); *H03G 3/30* (2013.01)

(58) Field of Classification Search
 CPC ........ H03F 1/0205; H03F 3/211; H03F 3/193; H03F 2200/318; H03F 3/191;
 (Continued)

(56) References Cited

U.S. PATENT DOCUMENTS 6,674,323 B2 * 1/2004 Kagaya .................. H03F 1/302
 330/124 R
7,482,868 B2 * 1/2009 Hageman .............. H03F 1/0277
 330/124 R (Continued)

FOREIGN PATENT DOCUMENTS

| JP | 2006-129443 A | 5/2006 |
| JP | 2015-126411 A | 7/2015 |
| KR | 10-2004-0046461 A | 6/2004 |

OTHER PUBLICATIONS

Office Action for KR Patent Application No. 10-2019-0115207 dated Feb. 4, 2021.

*Primary Examiner* — Khanh V Nguyen
(74) *Attorney, Agent, or Firm* — Pearne & Gordon LLP (57) ABSTRACT

A power amplifying circuit includes a first amplifying unit that amplifies a first radio-frequency signal and a second amplifying unit that amplifies a second radio-frequency signal. The first amplifying unit includes a first matching circuit that performs impedance matching for a circuit in a preceding stage, and a first amplifying circuit that amplifies the first radio-frequency signal that has passed through the first matching circuit. The second amplifying unit includes a second matching circuit that performs impedance matching for the circuit in the preceding stage, a resistor including a first end and a second end, the first end being electrically connected to the second matching circuit, and a second amplifying circuit that is electrically connected to the second end of the resistor and that amplifies the second radio-frequency signal that has passed through the resistor.

19 Claims, 6 Drawing Sheets

(51) Int. Cl.
*H03G 3/30* (2006.01)
*H03F 3/21* (2006.01)
*H03F 3/193* (2006.01)

(58) Field of Classification Search
CPC ...... H03F 1/565; H03F 2200/451; H03F 3/19;
H03F 3/21; H03F 3/245; H03F 2200/387;
H03F 2200/504; H03F 1/56; H03F 1/26;
H03G 3/30; H03G 1/0088; H03G 3/3042
USPC ... 330/124 R, 126, 144, 277, 284, 286, 295,
330/302, 310
See application file for complete search history.

(56) References Cited

U.S. PATENT DOCUMENTS

| | | | |
|---|---|---|---|
| 7,482,875 B2 * | 1/2009 | Tanoue | H03F 1/26 330/277 |
| 8,508,299 B2 * | 8/2013 | Kawano | H03F 1/0277 330/295 |
| 9,954,504 B2 * | 4/2018 | Oyama | H03F 3/213 |
| 2004/0113698 A1 * | 6/2004 | Kim | H03F 1/0288 330/295 |
| 2006/0066406 A1 | 3/2006 | Tanoue et al. | |
| 2015/0188505 A1 | 7/2015 | Saito | |

\* cited by examiner

POWER AMPLIFYING CIRCUIT AND POWER AMPLIFIER

This application claims priority from Japanese Patent Application No. JP2018-187328 filed on Oct. 2, 2018. The content of this application is incorporated herein by reference in its entirety.

BACKGROUND

The present disclosure relates to a power amplifying circuit and a power amplifier. A power amplifier equipped in a wireless communication terminal apparatus may be required to switch gain to change an output level in accordance with the distance between a base station and the terminal. For example, the power amplifier may be required to switch between amplification with a relatively high first gain (high gain) and amplification with a relatively low second gain (low gain).

Japanese Unexamined Patent Application Publication No. 2015-126411 describes a power amplifier module in which an attenuator that attenuates a radio-frequency signal is connected to an input terminal of an amplifier that amplifies the radio-frequency signal.

BRIEF SUMMARY

An amplifying transistor may be used both for amplification with a first gain (high gain) and amplification with a second gain (low gain). In this case, if an electrical or physical value (for example, the number of fingers) of the transistor is designed such that one of the first and second gains has a desired value, the other gain does not satisfy desired characteristics. For example, if the electrical or physical value of the transistor is adjusted such that the second gain (low gain) has a desired value, the transistor is incapable of causing the first gain (high gain) to have a desired value. In other words, there is a trade-off between the first gain and the second gain.

The present disclosure enables amplification with each of a plurality of gains to be designed with a desired value without necessarily causing a trade-off.

According to embodiments of the present disclosure, a power amplifying circuit includes a first amplifying unit that amplifies a first radio-frequency signal, and a second amplifying unit that amplifies a second radio-frequency signal. The first amplifying unit includes a first matching circuit that performs impedance matching for a circuit in a preceding stage, and a first amplifying circuit that amplifies the first radio-frequency signal that has passed through the first matching circuit. The second amplifying unit includes a second matching circuit that performs impedance matching for the circuit in the preceding stage, a resistor including a first end and a second end, the first end being electrically connected to the second matching circuit, and a second amplifying circuit that is electrically connected to the second end of the resistor and that amplifies the second radio-frequency signal that has passed through the resistor.

According to embodiments of the present disclosure, amplification with each of a plurality of gains can be designed with a desired value without necessarily causing a trade-off.

Other features, elements, characteristics and advantages of the present disclosure will become more apparent from the following detailed description of embodiments of the present disclosure with reference to the attached drawings.

DETAILED DESCRIPTION

Hereinafter, a power amplifying circuit and a power amplifier according to embodiments of the present disclosure will be described in detail with reference to the attached drawings. The embodiments do not limit the present disclosure. Each embodiment is an example, and configurations according to different embodiments can be partially replaced or combined. In a second embodiment, the same points as those in a first embodiment will not be described, but only different points will be described. In particular, similar functions and effects of similar configurations will not be mentioned for each embodiment.

Comparative Example

Figure 1:
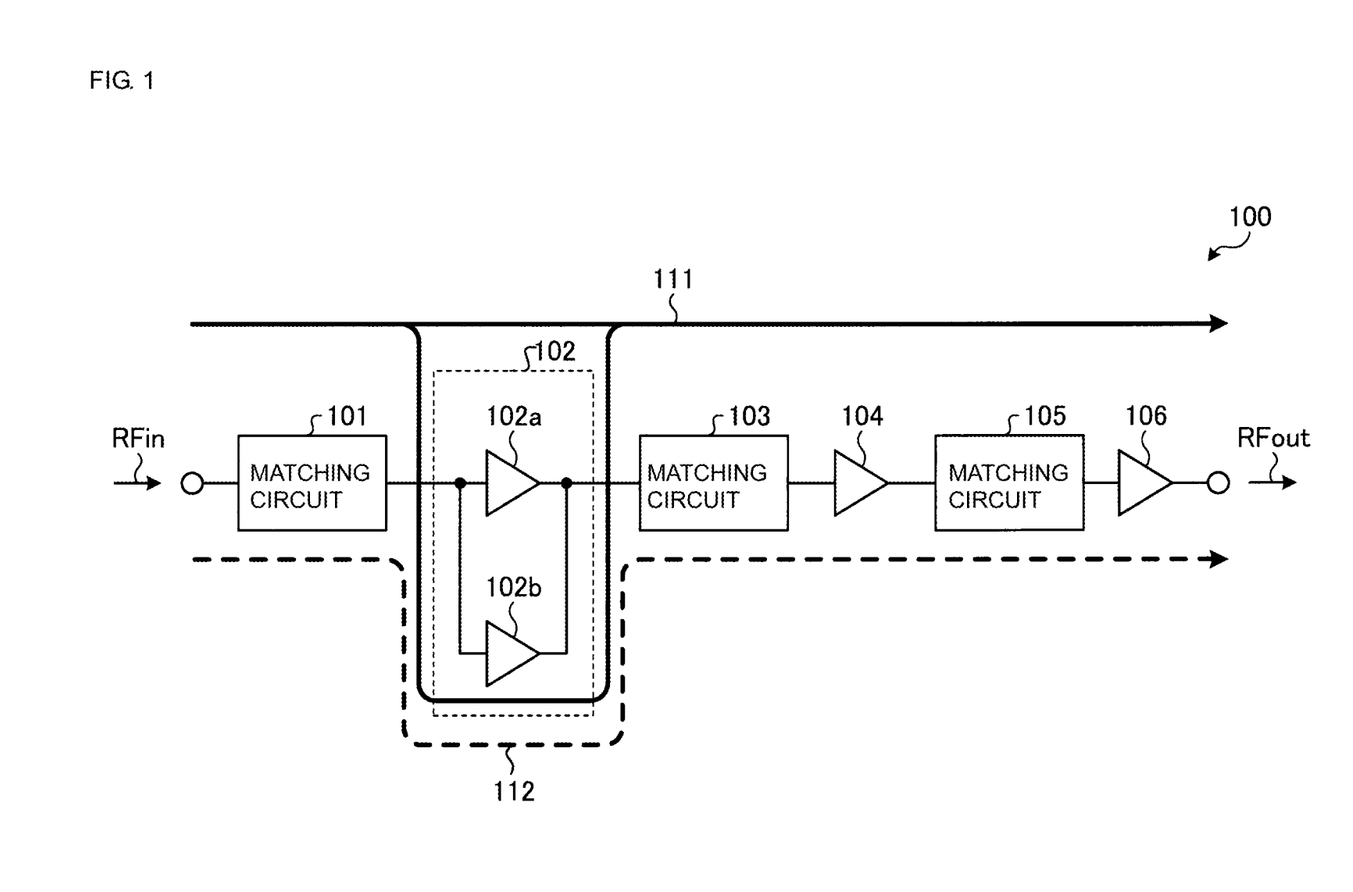
FIG. 1 is a diagram illustrating the configuration of a power amplifier according to a comparative example.

FIG. 1 is a diagram illustrating the configuration of a power amplifier 100 according to a comparative example. The power amplifier 100 amplifies a radio-frequency (RF) input signal RFin and outputs an RF output signal RFout. The power amplifier 100 is capable of switching between amplification with a relatively high first gain (high gain) and amplification with a relatively low second gain (low gain).

The power amplifier 100 includes a matching circuit 101, a first-stage power amplifying circuit 102, a matching circuit 103, an intermediate-stage power amplifying circuit 104, a matching circuit 105, and a last-stage power amplifying circuit 106.

The power amplifying circuit 102 includes a first amplifying unit 102a and a second amplifying unit 102b. The first amplifying unit 102a operates during amplification with the first gain and does not operate during amplification with the second gain. The second amplifying unit 102b operates during amplification with the first gain and during amplification with the second gain.

The matching circuit 101 performs impedance matching between a circuit in the preceding stage (for example, a signal generating circuit) and the power amplifying circuit 102. The matching circuit 103 performs impedance matching between the power amplifying circuit 102 and the power amplifying circuit 104. The matching circuit 105 performs impedance matching between the power amplifying circuit 104 and the power amplifying circuit 106.

An arrow 111 represents a path through which an RF signal flows during amplification with the first gain (high gain). As represented by the arrow 111, an RF input signal RFin that has passed through the matching circuit 101 is input to the first amplifying unit 102a and the second amplifying unit 102b.

The first amplifying unit 102a amplifies the RF input signal RFin and outputs the resulting RF signal to the matching circuit 103. The second amplifying unit 102b amplifies the RF input signal RFin and outputs the resulting RF signal to the matching circuit 103.

The power amplifying circuit 104 amplifies the RF signal that has passed through the matching circuit 103 and outputs the resulting RF signal to the matching circuit 105. The power amplifying circuit 106 amplifies the RF signal that has passed through the matching circuit 105 to generate an RF output signal RFout and outputs the RF output signal RFout to a circuit in the subsequent stage (for example, a front-end circuit).

An arrow 112 represents a path through which an RF signal flows during amplification with the second gain (low gain). As represented by the arrow 112, an RF input signal RFin that has passed through the matching circuit 101 is input to the second amplifying unit 102b.

The second amplifying unit 102b amplifies the RF input signal RFin and outputs the resulting RF signal to the matching circuit 103.

The power amplifying circuit 104 amplifies the RF signal that has passed through the matching circuit 103 and outputs the resulting RF signal to the matching circuit 105. The power amplifying circuit 106 amplifies the RF signal that has passed through the matching circuit 105 to generate an RF output signal RFout and outputs the RF output signal RFout to the circuit in the subsequent stage.

In this way, the second amplifying unit 102b is used both for amplification with the first gain (high gain) and amplification with the second gain (low gain).

If an electrical or physical value (for example, the number of fingers) of a transistor of the second amplifying unit 102b is adjusted such that one of amplification with the first gain and amplification with the second gain is performed with a desired value, the other amplification is affected thereby. For example, if the electrical or physical value of the transistor of the second amplifying unit 102b is adjusted such that amplification with the second gain (low gain) is performed with a desired value, the power amplifier 100 can be incapable of performing amplification with the first gain (high gain).

First Embodiment

Figure 2:
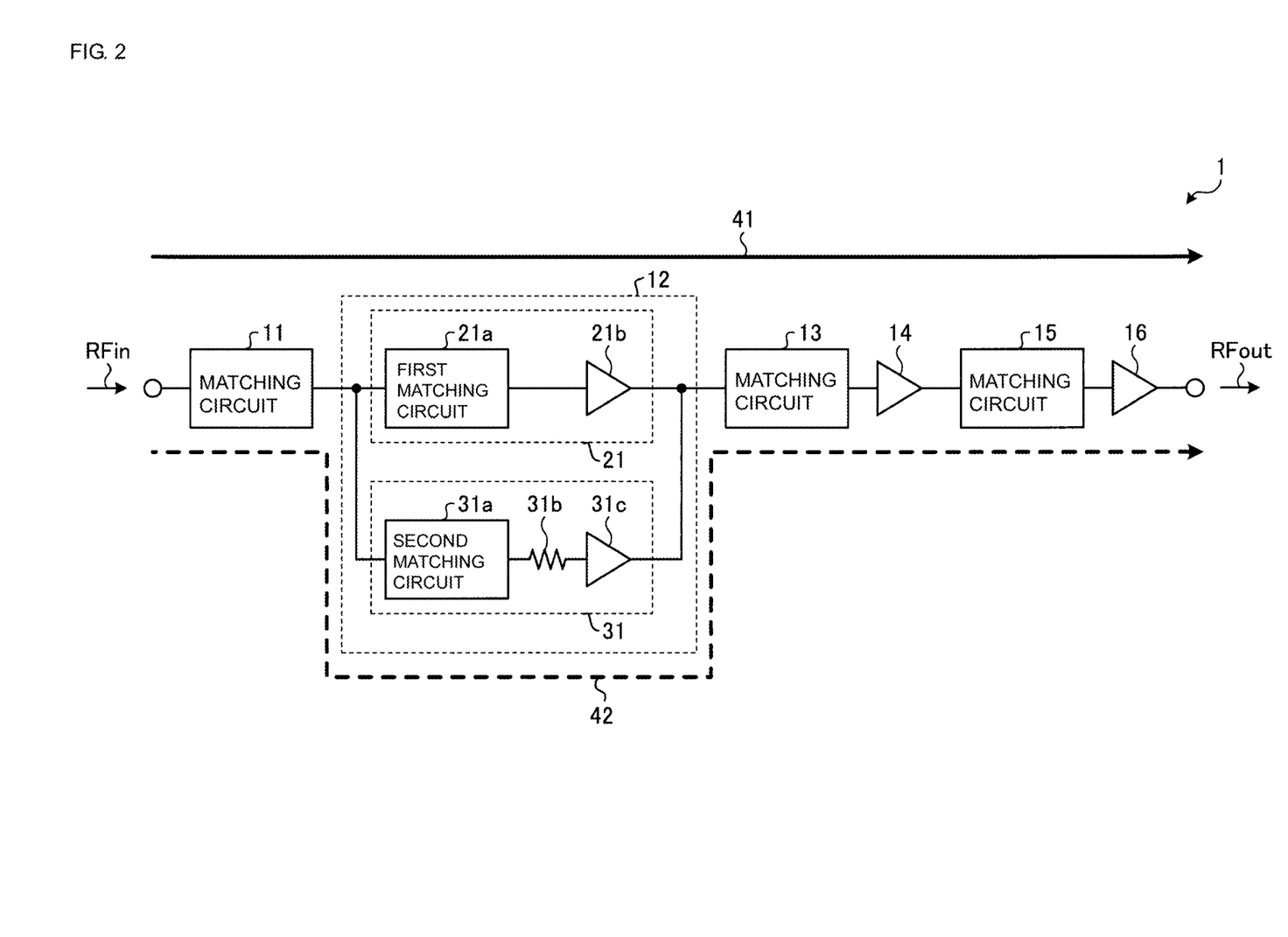
FIG. 2 is a diagram illustrating the configuration of a power amplifier according to a first embodiment.

FIG. 2 is a diagram illustrating the configuration of a power amplifier 1 according to the first embodiment. The power amplifier 1 amplifies an RF input signal RFin and outputs an RF output signal RFout. The power amplifier 1 is capable of switching between amplification with a relatively high first gain (high gain) and amplification with a relatively low second gain (low gain).

Hereinafter, an operation mode for performing amplification with the first gain (high gain) may be referred to as a high-power mode, and an operation mode for performing amplification with the second gain (low gain) may be referred to as a low-power mode.

The power amplifier 1 can be used to transmit various signals, such as audio signals and data signals, to a base station in a mobile communication apparatus, such as a cellular phone apparatus.

The power amplifier 1 amplifies an RF input signal RFin that has a radio frequency and that is received from a circuit in the preceding stage. Subsequently, the power amplifier 1 outputs an RF output signal RFout generated through the amplification to a circuit in the subsequent stage. The circuit in the preceding stage may be a transmission power control circuit that adjusts the power of a modulated signal, but the present disclosure is not limited thereto. The circuit in the subsequent stage may be a front-end circuit that performs filtering or the like on the RF output signal RFout and transmits the RF output signal RFout to an antenna, but the present disclosure is not limited thereto. The frequencies of the RF input signal RFin and the RF output signal RFout may be about several hundred MHz to several tens of GHz, but the present disclosure is not limited thereto.

The power amplifier 1 includes a matching circuit 11, a first-stage power amplifying circuit 12, a matching circuit 13, an intermediate-stage power amplifying circuit 14, a matching circuit 15, and a last-stage power amplifying circuit 16.

The power amplifying circuit 12 may also be referred to as a driver-stage power amplifying circuit. The power amplifying circuit 16 may also be referred to as a power-stage power amplifying circuit.

The power amplifying circuits 12, 14, and 16 constitute a three-stage power amplifying circuit, but the present disclosure is not limited thereto. The number of stages of the power amplifying circuit may be one, two, or four or more.

The power amplifying circuit 12 corresponds to the power amplifying circuit according to the present disclosure. The matching circuit 11 corresponds to the matching circuit according to the present disclosure. The power amplifying circuit 14 corresponds to the second power amplifying circuit according to the present disclosure.

The power amplifying circuit 12 includes a first amplifying unit 21 and a second amplifying unit 31. The first amplifying unit 21 operates during the high-power mode and does not operate during the low-power mode. The second amplifying unit 31 operates during the low-power mode and does not operate during the high-power mode.

The first amplifying unit 21 includes a first matching circuit 21a and a first amplifying circuit 21b.

The second amplifying unit 31 includes a second matching circuit 31a, a resistor 31b, and a second amplifying circuit 31c.

The matching circuit 11 performs impedance matching between the circuit in the preceding stage and the first amplifying circuit 21b by cooperating with the first matching circuit 21a. Also, the matching circuit 11 performs impedance matching between the circuit in the preceding stage and the second amplifying circuit 31c by cooperating with the second matching circuit 31a.

The matching circuit 13 performs impedance matching between the first amplifying circuit 21b and the power amplifying circuit 14 and also performs impedance matching between the second amplifying circuit 31c and the power amplifying circuit 14.

The matching circuit 15 performs impedance matching between the power amplifying circuit 14 and the power amplifying circuit 16.

An arrow 41 represents a path through which an RF signal passes during the high-power mode. As represented by the arrow 41, an RF input signal RFin that has passed through the matching circuit 11 and the first matching circuit 21a is input to the first amplifying circuit 21b.

The first amplifying circuit 21b amplifies the RF input signal RFin and outputs the resulting RF signal to the matching circuit 13.

The power amplifying circuit 14 amplifies the RF signal that has passed through the matching circuit 13 and outputs the resulting RF signal to the matching circuit 15. The power amplifying circuit 16 amplifies the RF signal that has passed through the matching circuit 15 to generate an RF output signal RFout and outputs the RF output signal RFout to the circuit in the subsequent stage.

An arrow 42 represents a path through which an RF signal passes during the low-power mode. As represented by the arrow 42, an RF input signal RFin that has passed through the matching circuit 11 and the second matching circuit 31a is attenuated by the resistor 31b. The RF input signal RFin that has been attenuated by the resistor 31b is input to the second amplifying circuit 31c.

The second amplifying circuit 31c amplifies the RF input signal RFin that has been attenuated by the resistor 31b and outputs the resulting RF signal to the matching circuit 13.

The power amplifying circuit 14 amplifies the RF signal that has passed through the matching circuit 13 and outputs the resulting RF signal to the matching circuit 15. The power amplifying circuit 16 amplifies the RF signal that has passed through the matching circuit 15 to generate an RF output signal RFout and outputs the RF output signal RFout to the circuit in the subsequent stage.

In this way, the first amplifying unit 21 is used in the high-power mode, and the second amplifying unit 31 is used in the low-power mode.

Figure 3:
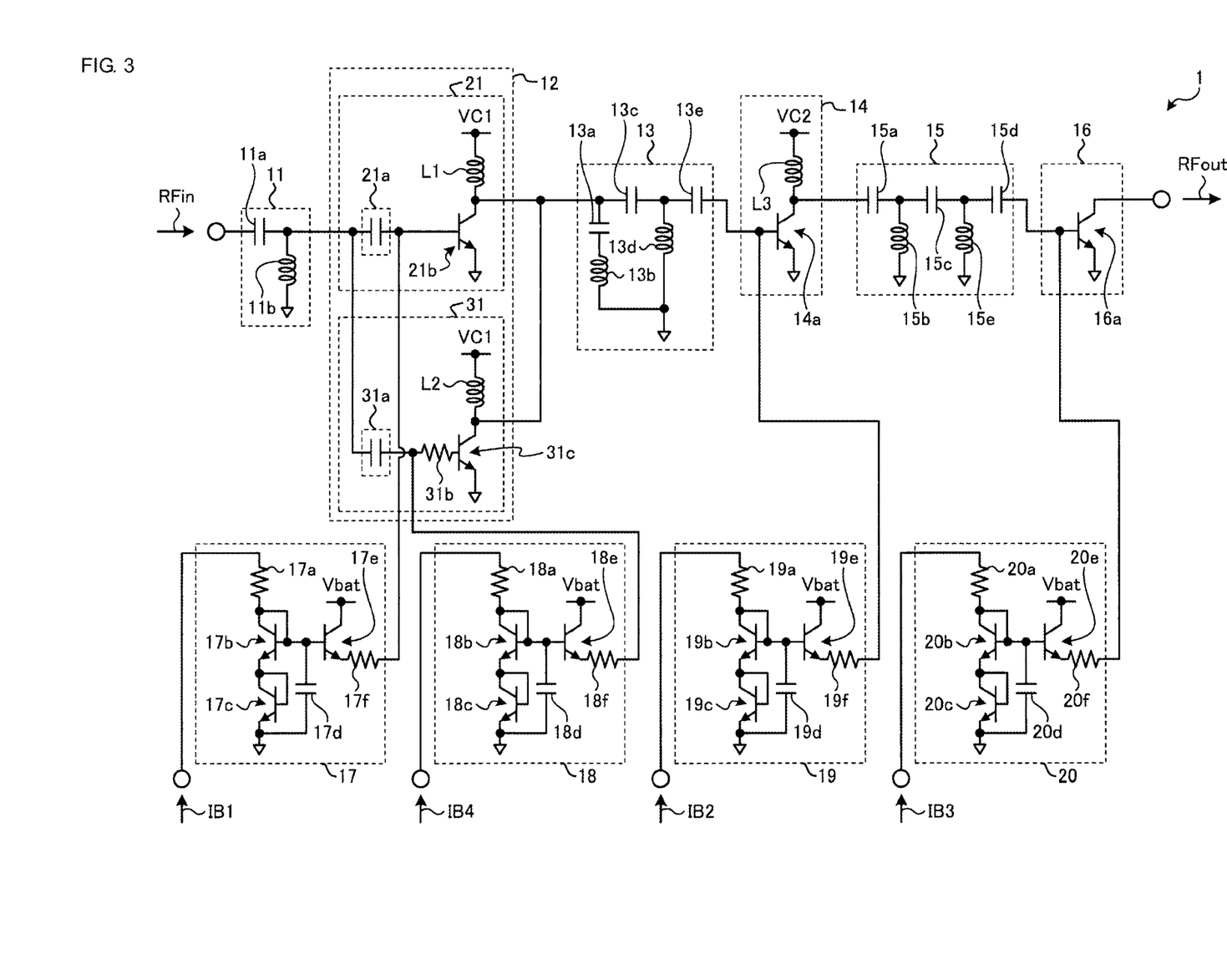
FIG. 3 is a diagram illustrating the circuit configuration of the power amplifier according to the first embodiment.

FIG. 3 is a diagram illustrating the circuit configuration of the power amplifier 1 according to the first embodiment.

The matching circuit 11 includes a capacitor 11a and an inductor 11b. The RF input signal RFin is input to one end of the capacitor 11a. The inductor 11b is electrically connected between the other end of the capacitor 11a and a reference potential. The reference potential may be a ground potential, but the present disclosure is not limited thereto.

The first matching circuit 21a includes a capacitor. One end of the capacitor of the first matching circuit 21a is electrically connected to the other end of the capacitor 11a. The capacitor of the first matching circuit 21a also functions as a DC-cut capacitor that passes an alternating current signal (for example, the RF input signal RFin) and blocks a direct current (for example, a bias current).

The first amplifying circuit 21b includes a transistor. The transistor may be a heterojunction bipolar transistor (HBT), but the present disclosure is not limited thereto. For example, the transistor may be a field effect transistor (FET). The transistor may be a multi-finger transistor formed of a plurality of unit transistors (also referred to as fingers) that are electrically connected in parallel to each other. A unit transistor is a minimum configuration for constituting a transistor.

The emitter of the transistor of the first amplifying circuit 21b is electrically connected to the reference potential. The base of the transistor of the first amplifying circuit 21b is electrically connected to the other end of the capacitor of the first matching circuit 21a. The base of the transistor of the first amplifying circuit 21b is supplied with a bias potential from a bias circuit 17. The collector of the transistor of the first amplifying circuit 21b is electrically connected to a power supply potential VC1 with a choke inductor L1 interposed therebetween.

The choke inductor L1 has a function of not passing AC power. It is assumed that the choke inductor L1 has a sufficiently high impedance with respect to the frequency bands of the RF input signal RFin and the RF output signal RFout. In other words, it is assumed that the impedance of the choke inductor L1 can be ignored when considering the frequency bands of the RF input signal RFin and the RF output signal RFout. In addition, the choke inductor L1 suppresses leakage of the RF input signal RFin and the RF output signal RFout to a power supply circuit.

The transistor of the first amplifying circuit 21b outputs the amplified RF signal from the collector to the matching circuit 13.

The bias circuit 17 includes a resistor 17a, transistors 17b, 17c, and 17e, a capacitor 17d, and a resistor 17f.

One end of the resistor 17a is supplied with a constant current IB1. Alternatively, the one end of the resistor 17a may be supplied with a constant voltage instead of the constant current IB1.

The constant current IB1 is supplied to the bias circuit 17 during the high-power mode. Accordingly, the bias circuit 17 supplies a bias potential to the first amplifying circuit 21b during the high-power mode. Accordingly, the first amplifying circuit 21b performs amplification during the high-power mode.

On the other hand, during the low-power mode, the constant current IB1 is not supplied to the bias circuit 17. Accordingly, the bias circuit 17 does not supply a bias potential to the first amplifying circuit 21b during the low-power mode. Accordingly, the first amplifying circuit 21b does not perform amplification during the low-power mode.

The other end of the resistor 17a is electrically connected to the collector and base of the transistor 17b. The transistor 17b is equivalent to a diode because the collector and base thereof are connected to each other. The configuration in which the collector and base of a transistor are connected to each other will be hereinafter referred to as the diode-connected configuration.

The emitter of the transistor 17b is electrically connected to the collector and base of the transistor 17c. The transistor 17c is diode-connected. The emitter of the transistor 17c is electrically connected to the reference potential.

The collector/base potential of the transistor 17b corresponds to the voltage drop across a collector-emitter path of the transistor 17b and a collector-emitter path of the transistor 17c, in other words, corresponds to the voltage drop across two diodes.

The capacitor 17d is electrically connected between a set of the collector and base of the transistor 17b and the reference potential. The capacitor 17d stabilizes the collector-base potential of the transistor 17b.

The base of the transistor 17e is electrically connected to the collector and base of the transistor 17b. The base of the transistor 17e is supplied with a base current through the resistor 17a. The base potential of the transistor 17e is identical to the collector-base potential of the transistor 17b. The transistor 17e may be an HBT or an FET.

The collector of the transistor 17e is electrically connected to a power supply potential Vbat.

The emitter of the transistor 17e is electrically connected to the base of the transistor of the first amplifying circuit 21b, with the resistor 17f interposed therebetween. Thus, the transistor 17e operates as an emitter follower circuit with an emitter output. Thus, the base potential of the transistor of the first amplifying circuit 21b is kept constant.

The second matching circuit 31a includes a capacitor. One end of the capacitor of the second matching circuit 31a is electrically connected to the other end of the capacitor 11a. The capacitor of the second matching circuit 31a also functions as a coupling capacitor that passes an alternating current signal (for example, the RF input signal RFin) and blocks a direct current (for example, a bias current).

One end of the resistor 31b is electrically connected to the other end of the capacitor of the second matching circuit 31a.

The second amplifying circuit 31c includes a transistor. The transistor may be, but is not limited to, an HBT. For example, the transistor may be an FET. The transistor may be a multi-finger transistor formed of a plurality of fingers that are electrically connected in parallel to each other.

The transistor of the second amplifying circuit 31c has a smaller number of fingers than the transistor of the first amplifying circuit 21b. With this configuration, the output power can be reduced and a desired gain can be obtained. Accordingly, the second amplifying circuit 31c is capable of reducing the second gain (low gain).

The emitter of the transistor of the second amplifying circuit 31c is electrically connected to the reference potential. The base of the transistor of the second amplifying circuit 31c is electrically connected to the other end of the resistor 31b.

The connection point between the second matching circuit 31a and the resistor 31b is supplied with a bias potential from a bias circuit 18.

The collector of the transistor of the second amplifying circuit 31c is electrically connected to the power supply potential VC1 with a choke inductor L2 interposed therebetween.

The choke inductor L2 has a function of not passing AC power. It is assumed that the choke inductor L2 has a sufficiently high impedance with respect to the frequency bands of the RF input signal RFin and the RF output signal RFout. In other words, it is assumed that the impedance of the choke inductor L2 can be ignored when considering the frequency bands of the RF input signal RFin and the RF output signal RFout. In addition, the choke inductor L2 suppresses leakage of the RF input signal RFin and the RF output signal RFout to the power supply circuit.

The transistor of the second amplifying circuit 31c outputs the amplified RF signal from the collector to the matching circuit 13.

The bias circuit 18 includes a resistor 18a, transistors 18b, 18c, and 18e, a capacitor 18d, and a resistor 18f.

The circuit configuration of the bias circuit 18 is similar to the circuit configuration of the bias circuit 17, and thus the description thereof is omitted.

A constant current IB4 is supplied to the bias circuit 18 during the low-power mode. Accordingly, the bias circuit 18 supplies a bias potential to the second amplifying circuit 31c during the low-power mode. Accordingly, the second amplifying circuit 31c performs amplification during the low-power mode.

On the other hand, during the high-power mode, the constant current IB4 is not supplied to the bias circuit 18. Accordingly, the bias circuit 18 does not supply a bias potential to the second amplifying circuit 31c during the high-power mode. Accordingly, the second amplifying circuit 31c does not perform amplification during the high-power mode.

The matching circuit 13 includes capacitors 13a, 13c, and 13e, and inductors 13b and 13d.

One end of the capacitor 13a is electrically connected to the collector of the transistor of the first amplifying circuit 21b and the collector of the transistor of the second amplifying circuit 31c. The inductor 13b is electrically connected between the other end of the capacitor 13a and the reference potential.

One end of the capacitor 13c is electrically connected to the collector of the transistor of the first amplifying circuit 21b and the collector of the transistor of the second amplifying circuit 31c. The inductor 13d is electrically connected between the other end of the capacitor 13c and the reference potential.

One end of the capacitor 13e is electrically connected to the other end of the capacitor 13c.

The power amplifying circuit 14 includes a transistor 14a. The transistor 14a may be, but is not limited to, an HBT. For example, the transistor 14a may be an FET. The transistor 14a may be a multi-finger transistor.

The emitter of the transistor 14a is electrically connected to the reference potential. The base of the transistor 14a is electrically connected to the other end of the capacitor 13e. The base of the transistor 14a is supplied with a bias potential from a bias circuit 19. The collector of the transistor 14a is electrically connected to a power supply potential VC2 with a choke inductor L3 interposed therebetween.

The bias circuit 19 includes a resistor 19a, transistors 19b, 19c, and 19e, a capacitor 19d, and a resistor 19f.

The circuit configuration of the bias circuit 19 is similar to the circuit configuration of the bias circuit 17, and thus the description thereof is omitted.

A constant current IB2 is supplied to the bias circuit 19 during the high-power mode and the low-power mode. Accordingly, the bias circuit 19 supplies a bias potential to the power amplifying circuit 14 during the high-power mode and the low-power mode. Accordingly, the power amplifying circuit 14 performs amplification during the high-power mode and the low-power mode.

The matching circuit 15 includes capacitors 15a, 15c, and 15d, and inductors 15b and 15e.

One end of the capacitor 15a is electrically connected to the collector of the transistor 14a. The inductor 15b is electrically connected between the other end of the capacitor 15a and the reference potential.

One end of the capacitor 15c is electrically connected to the other end of the capacitor 15a. The inductor 15e is electrically connected between the other end of the capacitor 15c and the reference potential.

One end of the capacitor 15d is electrically connected to the other end of the capacitor 15c.

The power amplifying circuit 16 includes a transistor 16a. The transistor 16a may be, but is not limited to, an HBT. For example, the transistor 16a may be an FET. The transistor 16a may be a multi-finger transistor.

The emitter of the transistor 16a is electrically connected to the reference potential. The base of the transistor 16a is electrically connected to the other end of the capacitor 15d. The base of the transistor 16a is supplied with a bias potential from a bias circuit 20. The transistor 16a outputs, from the collector, the RF output signal RFout to the circuit in the subsequent stage.

The bias circuit 20 includes a resistor 20a, transistors 20b, 20c, and 20e, a capacitor 20d, and a resistor 20f.

The circuit configuration of the bias circuit 20 is similar to the circuit configuration of the bias circuit 17, and thus the description thereof is omitted.

A constant current IB3 is supplied to the bias circuit 20 during the high-power mode and the low-power mode. Accordingly, the bias circuit 20 supplies a bias potential to the power amplifying circuit 16 during the high-power mode and the low-power mode. Accordingly, the power amplifying circuit 16 performs amplification during the high-power mode and the low-power mode.

The circuit configurations of the matching circuits 11, 13, and 15, the first matching circuit 21a, and the second matching circuit 31a are examples, and the present disclosure is not limited thereto. The matching circuits 11, 13, and 15, the first matching circuit 21a, and the second matching circuit 31a may each adopt various circuit configurations by using a capacitor (C), an inductor (L), or a resistor (R).

The circuit configurations of the first amplifying circuit 21b, the second amplifying circuit 31c, and the power amplifying circuits 14 and 16 are examples, and the present disclosure is not limited thereto. The first amplifying circuit 21b, the second amplifying circuit 31c, and the power amplifying circuits 14 and 16 may each adopt various circuit configurations by using a transistor.

The circuit configurations of the bias circuits 17, 18, 19, and 20 are examples, and the present disclosure is not limited thereto. The bias circuits 17, 18, 19, and 20 may each adopt various circuit configurations.

As described above, the first amplifying unit 21 performs amplification only during the high-power mode, and does not perform amplification during the low-power mode. Thus, even if an electrical or physical value of the transistor of the first amplifying circuit 21b is adjusted such that amplification in the high-power mode is performed with gain of a desired value, amplification in the low-power mode by the second amplifying unit 31 is not affected thereby.

The second amplifying unit 31 performs amplification only during the low-power mode, and does not perform amplification during the high-power mode. Thus, even if an electrical or physical value of the transistor of the second amplifying circuit 31c is adjusted such that amplification in the low-power mode is performed with gain of a desired value, amplification in the high-power mode by the first amplifying unit 21 is not affected thereby. Thus, there is no trade-off between the high-power mode and the low-power mode, and both the modes can be independent of each other.

Thus, the power amplifier 1 can be capable of performing amplification with each of the first gain (high gain) and the second gain (low gain).

Figure 4:
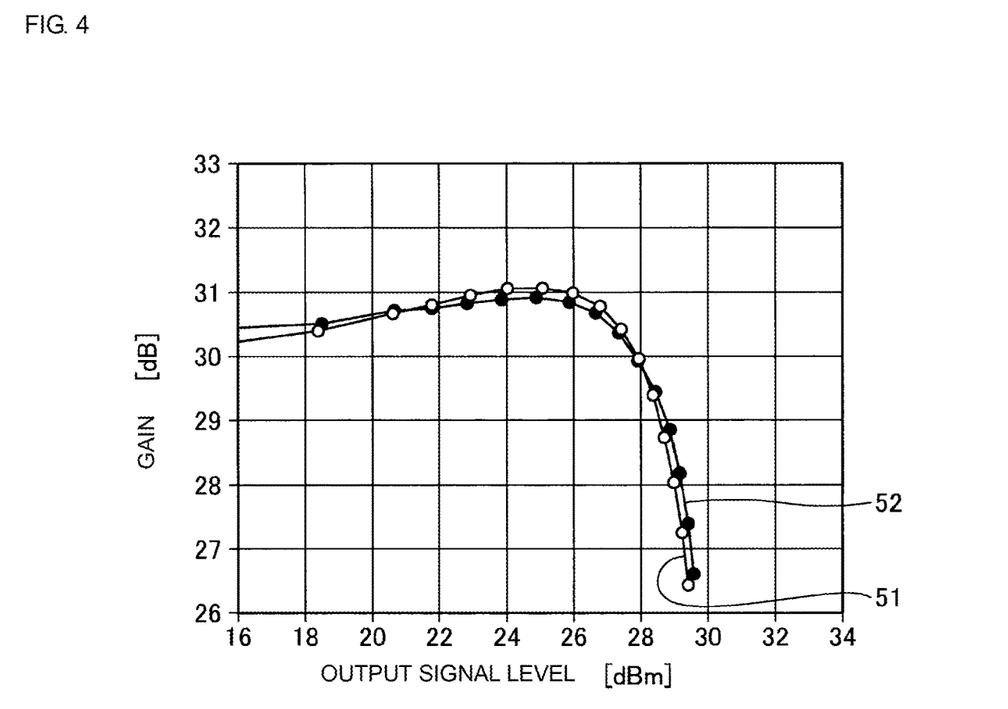
FIG. 4 is a graph illustrating characteristics of the power amplifier according to the first embodiment.
Figure 5:
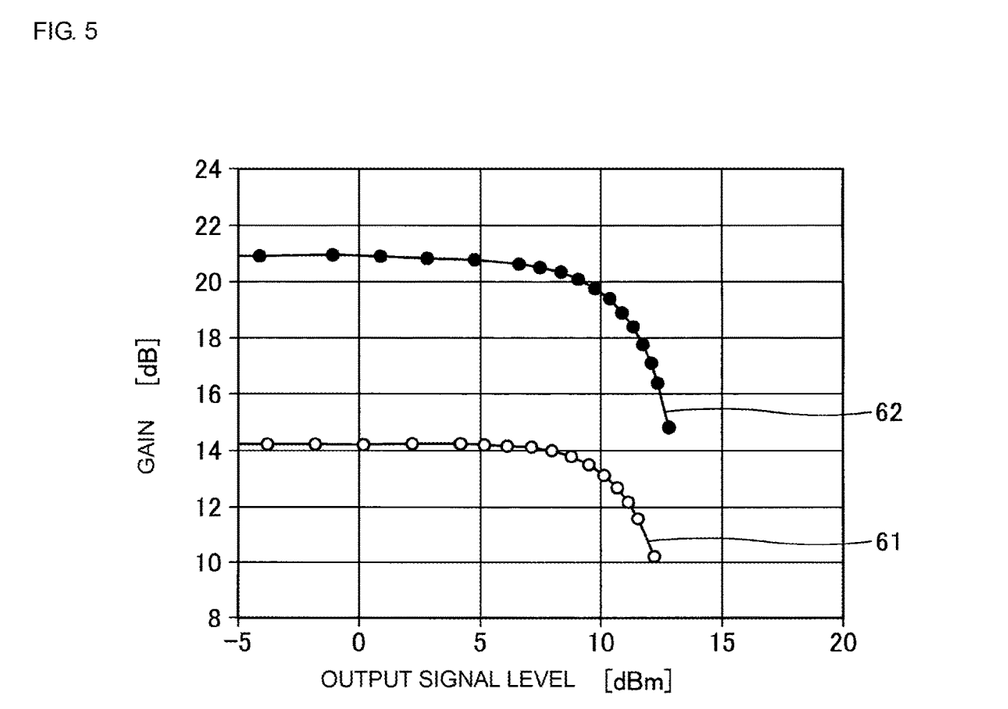
FIG. 5 is a graph illustrating characteristics of the power amplifier according to the first embodiment.

FIGS. 4 and 5 are graphs illustrating the characteristics of the power amplifier 1 according to the first embodiment. Specifically, FIG. 4 is a graph illustrating the relationship between the RF output signal RFout (dBm) and the gain (dB) of the power amplifier 1 during the high-power mode. FIG. 5 is a graph illustrating the relationship between the RF output signal RFout (dBm) and the gain (dB) of the power amplifier 1 during the low-power mode.

In FIG. 4, a line 51 represents the relationship between the RF output signal RFout (dBm) and the gain (dB) of the power amplifier 1 during the high-power mode. A line 52 represents the relationship between the RF output signal RFout (dBm) and the gain (dB) of the power amplifier 100 according to the comparative example during the high-power mode.

The power amplifier 1 exhibits characteristics substantially similar to those of the power amplifier 100 according to the comparative example.

In FIG. 5, a line 61 represents the relationship between the RF output signal RFout (dBm) and the gain (dB) of the power amplifier 1 during the low-power mode. A line 62 represents the relationship between the RF output signal RFout (dBm) and the gain (dB) of the power amplifier 100 according to the comparative example during the low-power mode.

During the low-power mode, the power amplifier 1 is capable of significantly decrease the gain compared to the power amplifier 100 according to the comparative example. The reasons for this are as follows. First, the second amplifying unit 31 can include the resistor 31b because the second amplifying unit 31 does not perform amplification during the high-power mode. With use of the resistor 31b, the second amplifying unit 31 is capable of attenuating the RF input signal RFin. Secondly, because the second amplifying unit 31 does not perform amplification during the high-power mode, the number of fingers of the transistor of the second amplifying circuit 31c can be made smaller than the number of fingers of the transistor of the first amplifying circuit 21b.

As illustrated in FIGS. 4 and 5, the power amplifier 1 is capable of performing amplification with the first gain (high gain) and amplification with the second gain (low gain) using desired values.

Figure 6:
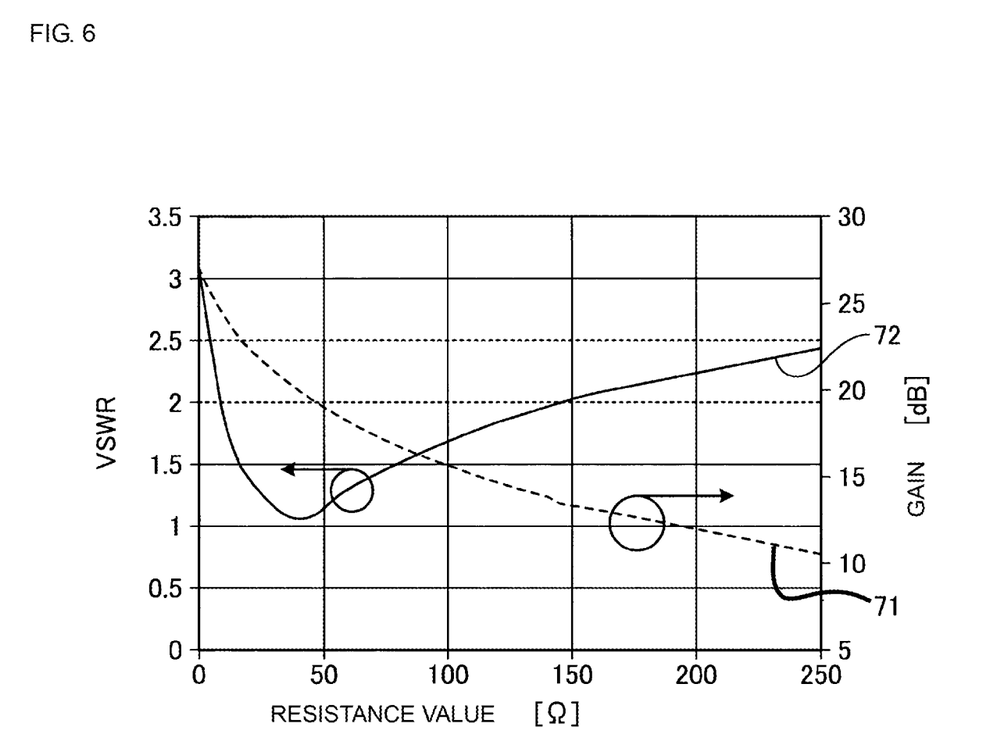
FIG. 6 is a graph illustrating characteristics of the power amplifier according to the first embodiment.

FIG. 6 is a graph illustrating the characteristics of the power amplifier 1 according to the first embodiment. Specifically, FIG. 6 is a graph illustrating the relationship between the resistance value (ohms) of the resistor 31b and the gain (dB) of the power amplifier 1 during the low-power mode. FIG. 6 also illustrates the relationship between the resistance value (ohms) of the resistor 31b and the input-side voltage standing wave ratio (VSWR) of the power amplifier 1 during the low-power mode.

In FIG. 6, a line 71 represents the relationship between the resistance value of the resistor 31b and the gain. A line 72 represents the relationship between the resistance value of the resistor 31b and the input-side VSWR.

As represented by the line 71, the gain monotonously decreases as the resistance value of the resistor 31b increases. In other words, the gain (dB) can be decreased by increasing the resistance value of the resistor 31b.

As represented by the line 72, the input-side VSWR is minimum when the resistance value of the resistor 31b is approximately 40 ohms, and then increases.

Thus, it is desirable to determine the range of the resistance value of the resistor 31b in the case of controlling the input-side VSWR.

For example, in the case of controlling the input-side VSWR to about 2.5 or less, it is desirable that the resistance value of the resistor 31b be within a range of about 4 ohms to about 250 ohms.

For example, in the case of controlling the input-side VSWR to about 2 or less, it is desirable that the resistance value of the resistor 31b be within a range of about 10 ohms to about 140 ohms.

Second Embodiment

Figure 7:
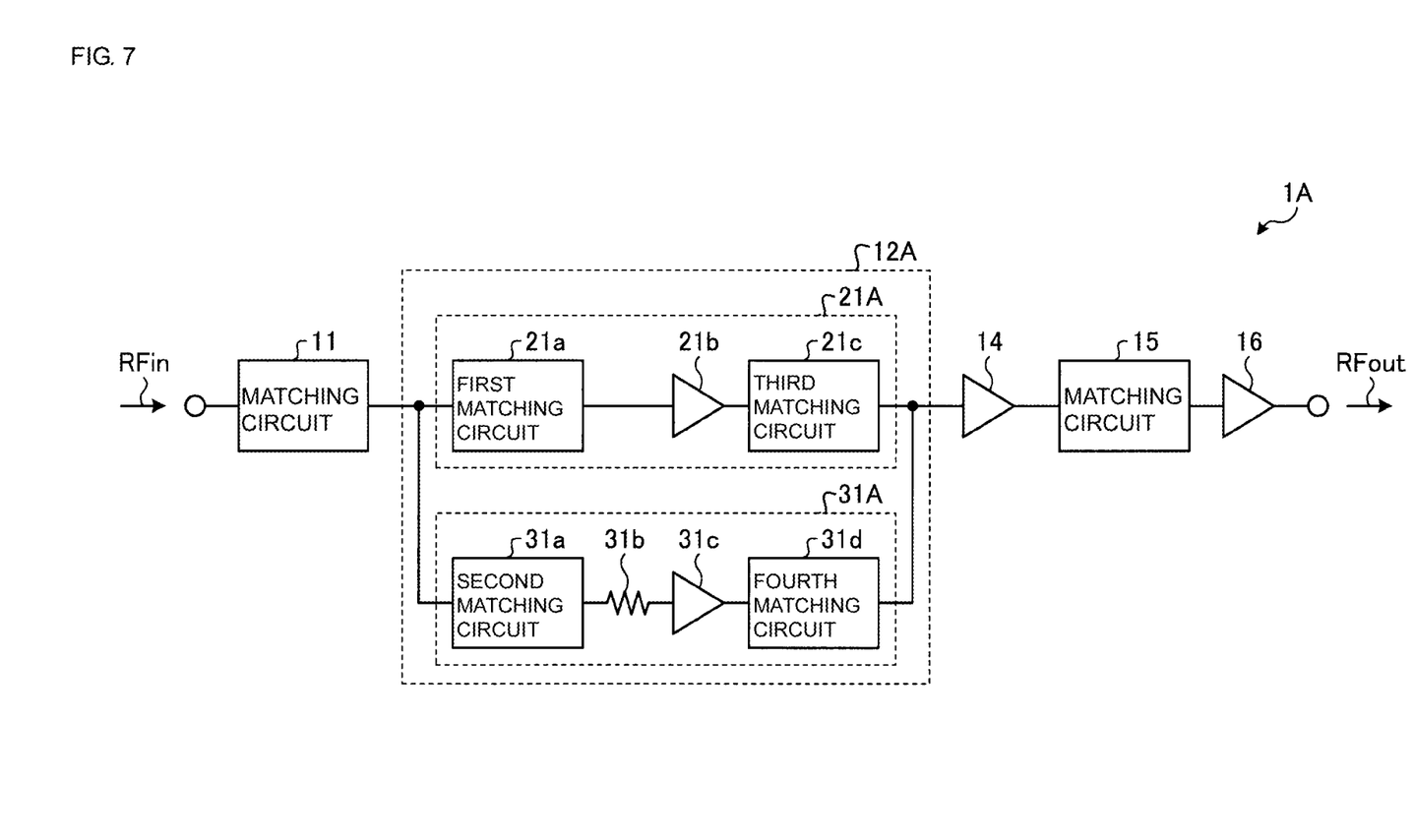
FIG. 7 is a diagram illustrating the configuration of a power amplifier according to a second embodiment.

FIG. 7 is a diagram illustrating the configuration of a power amplifier 1A according to the second embodiment. The power amplifier 1A is different from the power amplifier 1 according to the first embodiment (see FIG. 2) in including a power amplifying circuit 12A instead of the power amplifying circuit 12. Unlike the power amplifier 1 according to the first embodiment, the power amplifier 1A does not include the matching circuit 13.

The power amplifying circuit 12A includes a first amplifying unit 21A and a second amplifying unit 31A. The first amplifying unit 21A operates during the high-power mode and does not operate during the low-power mode. The second amplifying unit 31A operates during the low-power mode and does not operate during the high-power mode.

The first amplifying unit 21A includes a third matching circuit 21c in addition to the first matching circuit 21a and the first amplifying circuit 21b.

The third matching circuit 21c performs impedance matching between the first amplifying circuit 21b and the power amplifying circuit 14.

The second amplifying unit 31A includes a fourth matching circuit 31d in addition to the second matching circuit 31a, the resistor 31b, and the second amplifying circuit 31c.

The fourth matching circuit 31d performs impedance matching between the second amplifying circuit 31c and the power amplifying circuit 14.

The power amplifier 1A includes the third matching circuit 21c and the fourth matching circuit 31d. Accordingly, the power amplifier 1A is capable of individually performing impedance matching between the first amplifying circuit 21b and the power amplifying circuit 14 and impedance matching between the second amplifying circuit 31c and the power amplifying circuit 14. Thus, the power amplifier 1A is capable of more effectively adjusting an electrical or physical value of the transistor of the first amplifying circuit 21b and an electrical or physical value of the transistor of the second amplifying circuit 31c. Accordingly, the power amplifier 1A is capable of performing amplification with the first gain (high gain) and amplification with the second gain (low gain) independently of each other.

The above-described embodiments are given for easy understanding of the present disclosure and are not intended to limit the interpretation of the present disclosure. The present disclosure can be changed or improved without necessarily deviating from the gist thereof, and includes the equivalents thereof.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifying circuit comprising:
   a first amplifying unit that amplifies a first radio-frequency signal; and
   a second amplifying unit that amplifies a second radio-frequency signal,
   the first amplifying unit including
      a first matching circuit that performs impedance matching for a circuit in a preceding stage, and
      a first amplifying circuit that amplifies the first radio-frequency signal that has passed through the first matching circuit,
   the second amplifying unit including
      a second matching circuit that performs impedance matching for the circuit in the preceding stage,
      a resistor including a first end and a second end, the first end being electrically connected to the second matching circuit, and
      a second amplifying circuit that is electrically connected to the second end of the resistor and that amplifies the second radio-frequency signal that has passed through the resistor, wherein:
   the first amplifying unit further includes a third matching circuit that performs impedance matching between the first amplifying circuit and a circuit in a subsequent stage, and
   the second amplifying unit further includes a fourth matching circuit that performs impedance matching between the second amplifying circuit and the circuit in the subsequent stage.

2. The power amplifying circuit according to claim 1, wherein
   the first amplifying circuit and the second amplifying circuit each include a multi-finger transistor, and
   the second amplifying circuit has a smaller number of fingers than the first amplifying circuit.

3. The power amplifying circuit according to claim 1, wherein
   the resistor has a resistance value that is within a range of about 4 ohms to about 250 ohms.

4. The power amplifying circuit according to claim 2, wherein
   the resistor has a resistance value that is within a range of about 4 ohms to about 250 ohms.

5. The power amplifying circuit according to claim 1, wherein
   the resistor has the resistance value that is within a range of about 10 ohms to about 140 ohms.

6. The power amplifying circuit according to claim 1, wherein the first amplifying unit has a first gain and the second amplifying unit has a second gain, the first gain being larger than the second gain.

7. The power amplifying circuit according to claim 4, wherein the first amplifying unit has a first gain and the second amplifying unit has a second gain, the first gain being larger than the second gain.

8. The power amplifying circuit according to claim 2, wherein the first amplifying unit has a first gain and the second amplifying unit has a second gain, the first gain being larger than the second gain.

9. The power amplifying circuit according to claim 3, wherein the first amplifying unit has a first gain and the second amplifying unit has a second gain, the first gain being larger than the second gain.

10. A power amplifying circuit comprising:
    a first amplifying unit that amplifies a first radio-frequency signal; and
    a second amplifying unit that amplifies a second radio-frequency signal,
    the first amplifying unit including
       a first matching circuit that performs impedance matching for a circuit in a preceding stage, and
       a first amplifying circuit that amplifies the first radio-frequency signal that has passed through the first matching circuit,
    the second amplifying unit including
       a second matching circuit that performs impedance matching for the circuit in the preceding stage,
       a resistor including a first end and a second end, the first end being electrically connected to the second matching circuit, and
       a second amplifying circuit that is electrically connected to the second end of the resistor and that amplifies the second radio-frequency signal that has passed through the resistor, wherein
    the first amplifying circuit and the second amplifying circuit each include a multi-finger transistor, and
    the second amplifying circuit has a smaller number of fingers than the first amplifying circuit.

11. The power amplifying circuit according to claim 10, wherein
    the resistor has a resistance value that is within a range of about 4 ohms to about 250 ohms.

12. The power amplifying circuit according to claim 10, wherein the first amplifying unit has a first gain and the second amplifying unit has a second gain, the first gain being larger than the second gain.

13. A power amplifier comprising:
    the power amplifying circuit according to claim 1; and
    a fifth matching circuit that is electrically connected between the circuit in the preceding stage and a set of the first matching circuit and the second matching circuit, the fifth matching circuit performing impedance matching between the circuit in the preceding stage and the first amplifying circuit by cooperating with the first matching circuit, and impedance matching between the circuit in the preceding stage and the second amplifying circuit by cooperating with the second matching circuit.

14. The power amplifier according to claim 13, further comprising a second power amplifying circuit that amplifies the first or second radio-frequency signal that has been amplified by the power amplifying circuit.

15. The power amplifier according to claim 13, wherein the first amplifying unit has a first gain and the second amplifying unit has a second gain, the first gain being larger than the second gain.

16. The power amplifier according to claim 14, wherein the first amplifying unit has a first gain and the second amplifying unit has a second gain, the first gain being larger than the second gain.

17. The power amplifier according to claim 14, further comprising a sixth matching circuit configured to perform impedance matching between the first amplifying circuit and the second power amplifying circuit, and configured to perform impedance matching between the second amplifying circuit and the second power amplifying circuit.

18. The power amplifier according to claim 17, further comprising a third amplifying circuit and a seventh matching circuit configured to perform impedance matching between the second power amplifying circuit and the third power amplifying circuit.

19. A power amplifier comprising:
the power amplifying circuit according to claim 10; and
a fifth matching circuit that is electrically connected between the circuit in the preceding stage and a set of the first matching circuit and the second matching circuit, the fifth matching circuit performing impedance matching between the circuit in the preceding stage and the first amplifying circuit by cooperating with the first matching circuit, and impedance matching between the circuit in the preceding stage and the second amplifying circuit by cooperating with the second matching circuit.

* * * * *